United States Patent
Ferland et al.

(10) Patent No.: US 6,525,266 B2
(45) Date of Patent: Feb. 25, 2003

(54) CIRCUIT-BOARD MOUNTED CLIP FOR ELECTROMAGNETIC INTERFERENCE REDUCTION

(75) Inventors: William M. Ferland, Somersworth, NH (US); Martin Q. Thornton, Lee, NH (US); Edward J. Wilson, Gilford, NH (US); John M. Devine, Hampton, NH (US)

(73) Assignee: Enterasys Networks, Inc., Rochester, NH (US)

(*) Notice: Subject to any disclaimer, the term of this patent is extended or adjusted under 35 U.S.C. 154(b) by 0 days.

(21) Appl. No.: 09/907,331

(22) Filed: Jul. 17, 2001

(65) Prior Publication Data

US 2003/0015331 A1 Jan. 23, 2003

(51) Int. Cl.⁷ .................................. H05K 9/00
(52) U.S. Cl. .................. 174/35 GC; 361/796; 361/800
(58) Field of Search ............. 174/35 GC, 35 R; 361/816, 818, 800, 799, 796

(56) References Cited

U.S. PATENT DOCUMENTS

| | | | | |
|---|---|---|---|---|
| 5,001,297 A | * | 3/1991 | Peregrim et al. | 174/35 GC |
| 5,638,259 A | * | 6/1997 | McCarthy et al. | 361/800 |
| 6,043,991 A | * | 3/2000 | Sorrentino | 361/816 |

* cited by examiner

Primary Examiner—Hung V. Ngo
(74) Attorney, Agent, or Firm—Chris A. Caseiro

(57) ABSTRACT

An Electromagnetic Interference (EMI) shielding system including a conductive clip for electrically coupling a printed circuit board (PCB) to a grounding structure. The clip includes a first contact section attached to a side rather than an edge of the PCB, and a second contact section for contacting the grounding structure. The clip is compressible to ensure a tight fit of the second contact section to the grounding structure. The clip may be formed as a unitary structure and includes transition regions between the first and second contact sections that provide flexibility to the structure. Edge flaps may optionally be included to enhance surface contact of the clip to the PCB. The second contact region is preferably designed with a flat top surface to enable automated surface mounting.

6 Claims, 4 Drawing Sheets

CIRCUIT-BOARD MOUNTED CLIP FOR ELECTROMAGNETIC INTERFERENCE REDUCTION

BACKGROUND OF THE INVENTION

1. Field of the Invention

The present invention relates to devices to minimize the causes and effects of electromagnetic interference. More particularly, the present invention relates to devices to ground printed circuit boards to the housings, chassis, containers, etc., in which they are installed so as to reduce the generation of electromagnetic interference waves by devices including such circuit boards.

2. Description of the Prior Art

Electromagnetic interference (EMI) is an electrical disturbance in an electronics-based system. EMI is caused by natural phenomena, such as lightning, by low-frequency waves emitted from electromechanical devices, such as motors, or by high-frequency waves emitted from integrated circuits and other electronic devices, such as routers. In the United States, the Federal Communications Commission sets limits on the EMI output of electronic devices. Other countries set their own limits on the EMI output of electronic devices. It is therefore necessary for anyone or any company involved in the fabrication, manufacture, and/or sale of electronic devices to comply with the limitations imposed. In particular, it is necessary to ensure that EMI emissions coming from electronic devices in use are at or below the levels imposed in particular jurisdictions.

Networking equipment including routers, bridges, and switches for example, is one group of electronic devices susceptible to, and capable of causing, EMI emissions. As a result, they are subject to EMI output limitations. Of course, there are many other electronic devices subject to such limitations. By their nature, networking devices generate substantial emission energy that must be managed. They typically include one or more printed circuit boards (PCB) that transfer electrical signals on such boards, among other PCBs, and across transmission media to other electronic equipment.

High frequency transmissions associated with the transfer of electrical signals in and across networking equipment can generate substantial flux if low-inductance current pathways are not provided. For this reason, it is common practice to provide EMI shielding to dissipate generated emissions (and additionally to reflect incoming emissions that may disrupt system operation). It is a relatively common practice to use the housing or chassis that retains the networking equipment as part of the shielding. Specifically, the chassis, which includes slots or board cages to retain a plurality of PCBs therein, provides a good platform to divert current associated with each PCB retained therein to ground.

As more electronic components are installed in the same available space on PCBs, and surface mount technology enabling component application on both sides of a PCB, the EMI shielding task has become greater. It is therefore desirable to have an EMI shielding system that is sufficiently robust to ensure that EMI output limitations continue to be met. It has been observed that the application of gasketing material to the chassis perimeter likely does not provide that robustness. It is also desirable to have an EMI shielding system that can be implemented without requiring modifications to the chassis itself, particularly when there is a desire to upgrade PCBs for installation in existing chassis. Further, it is desirable to have an EMI shielding system including conductor clips for grounding individual PCBs to the chassis, which conductor clips may be mounted to the PCB in an automated, rather than manual, manner for ease and accuracy of placement. Yet further, it is desirable to provide one or more such conductor clips that may be positioned in a variety of locations including on either surface of a PCB with a profile that minimizes the possibility of clip damage. An EMI shielding system including one or more conductor clips with the noted characteristics would be of advantage in the fabrication of electronic devices including, but not limited to, networking equipment.

SUMMARY OF THE INVENTION

It is an object of the present invention to provide an EMI shielding system that is sufficiently robust to ensure that EMI output limitations are met. It is also an object of the present invention to provide an EMI shielding system that can be implemented without requiring modifications to the chassis itself. Further, it is an object of the present invention to provide a conductor clip employed as part of the EMI shielding system for grounding individual PCBs to the chassis, which conductor clip is mountable using "pick-and-place" surface mount technology. Yet further, it is an object of the present invention to provide such a conductor clip positionable in a variety of locations including on either surface of a PCB with a profile that minimizes the possibility of clip damage.

These and other objects are achieved with the present invention, a conductor clip that is substantially mountable on the front side, the back side, or both sides of a PCB, preferably at its perimeter. The clip is further configured to permit installation of the modified PCB in a slot of a board mounting chassis so that each clip contacts at least the inner surface of the slot. The clip of the present invention thereby establishes a grounding pathway between the PCB and the chassis so as to enable dispersion of EMI waves generated by the circuitry associated with the PCB.

The clip is formed of a conductive material including, for example, a solderable combination of tin and lead, copper, beryllium-copper, or other suitable material well known to those having knowledge of EMI shielding materials. The clip includes a first contact section that interfaces with the side of the PCB to which it is applied, and a flexible or compressible second contact section that interfaces with the surface of a chassis slot or other structure suitable for current grounding. Optionally, the clip includes an edge interface flap that may be used to contact the edge of the PCB. The clip may be formed of individual sections joined together or, preferably, as a unitary component. The clip is surface mountable on the PCB with a low profile and the compressible section substantially ensures good contact with the chassis slot while minimizing the possibility of clip breakage. The clip is preferably configured with dimensions suitable to enable the automated placement and attachment of the clip to the PCB using existing automated surface mounting equipment.

The conductor clip of the present invention forms part of a complete EMI shielding system including the grounding chassis and conductive pathways designed into the PCBs. The clip couples the chassis to those conductive pathways as a structure that is surface, rather than edge, mounted. Its design enables automated assembly application, thereby improving manufacturing efficiencies. The surface mounting and low structure profile reduce clip damage, further ensuring effective EMI dissipation. The surface mounting also provides flexibility in the positioning of the clip in that it may be installed on either side of the PCB anywhere along the perimeter, without varying the design. These and other advantages will become apparent upon review of the following detailed description, the accompanying drawings, and the appended claims.

DETAILED DESCRIPTION OF THE PREFERRED EMBODIMENT OF THE INVENTION

Figure 1:
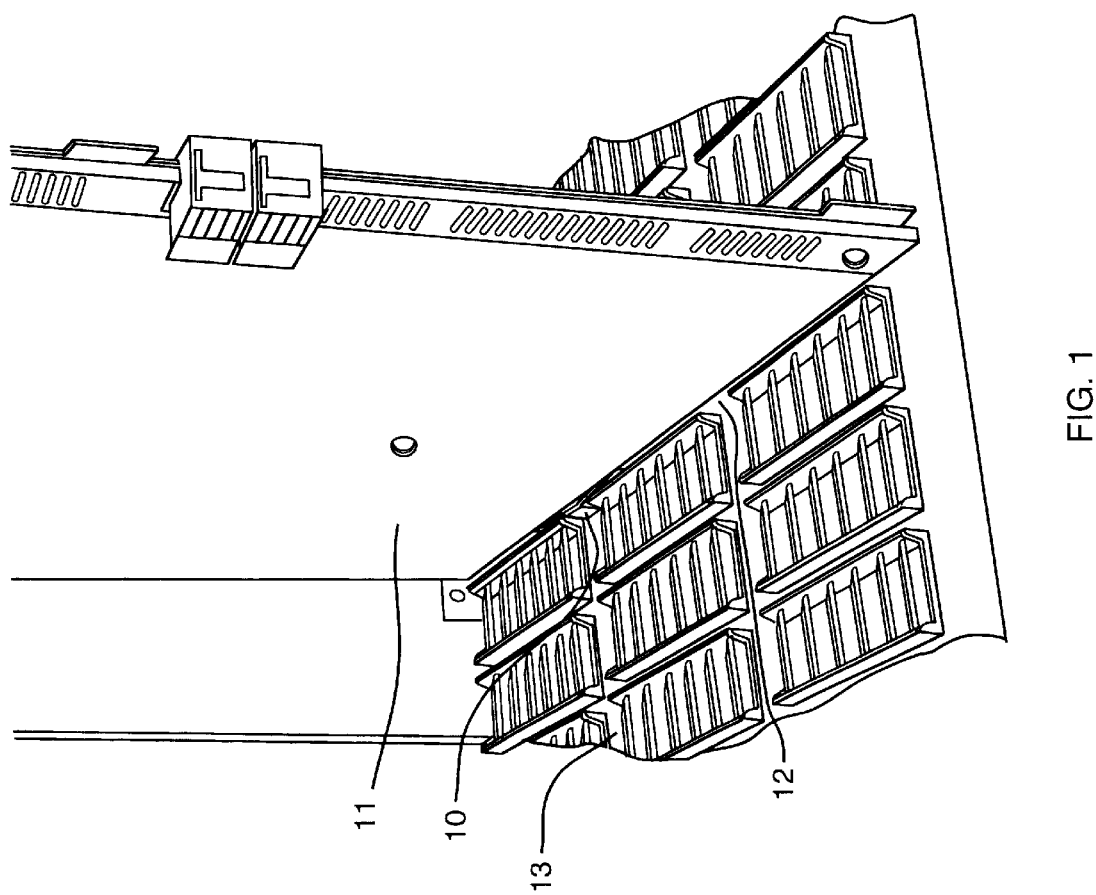
FIG. 1 is a perspective view of a printed circuit board positioned in a chassis, the printed circuit board including one or more of the conductor clips of the present invention.
Figure 2:
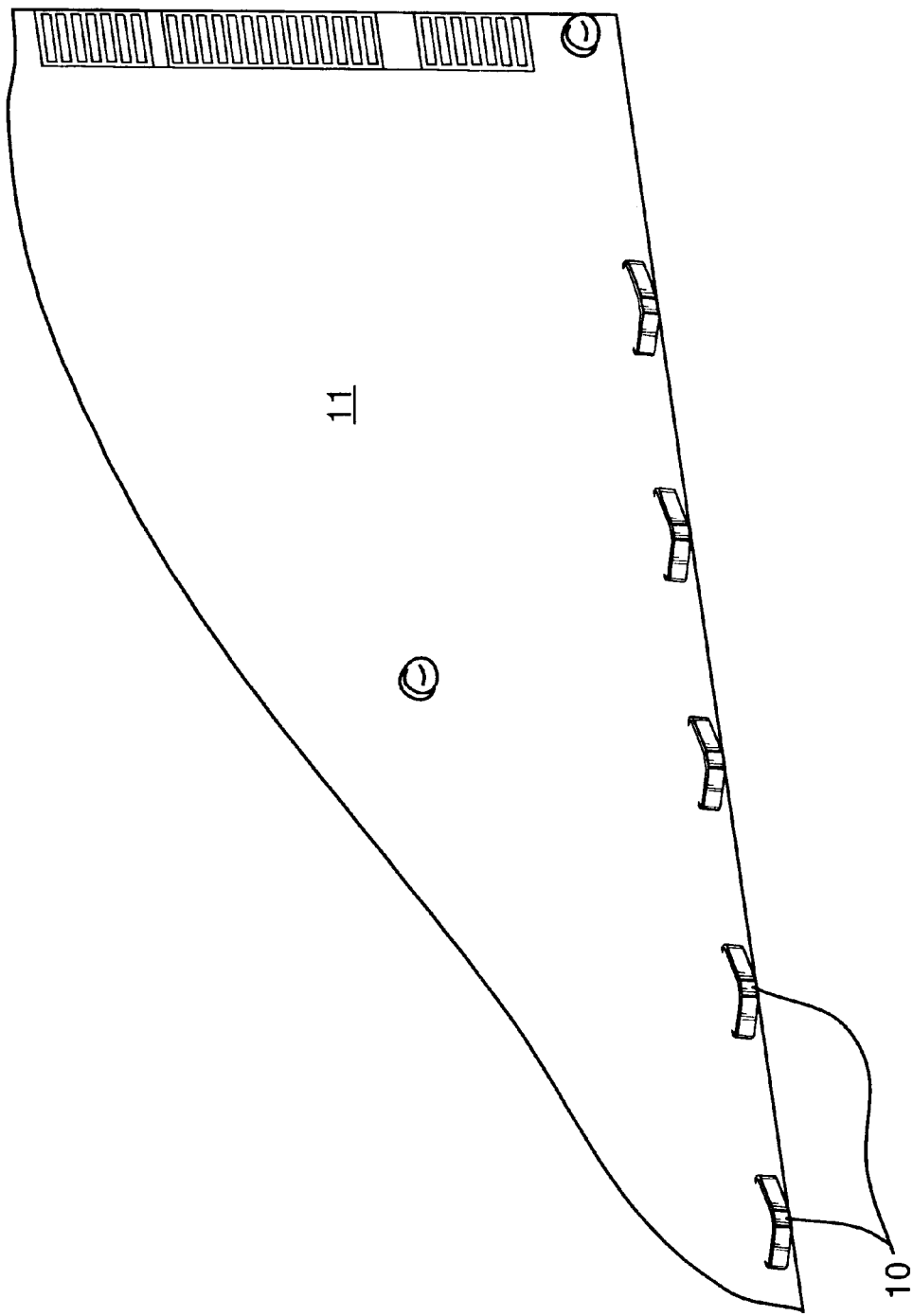
FIG. 2 is a perspective view of a printed circuit board including a plurality it of conductor clips of the present invention attached thereto.
Figure 4:
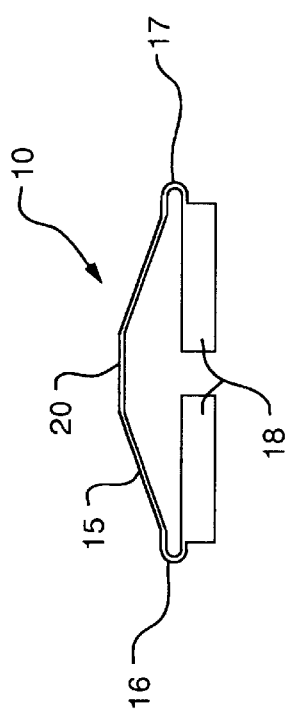
FIG. 4 is a side view of the conductor clip of the present invention.
Figure 3:
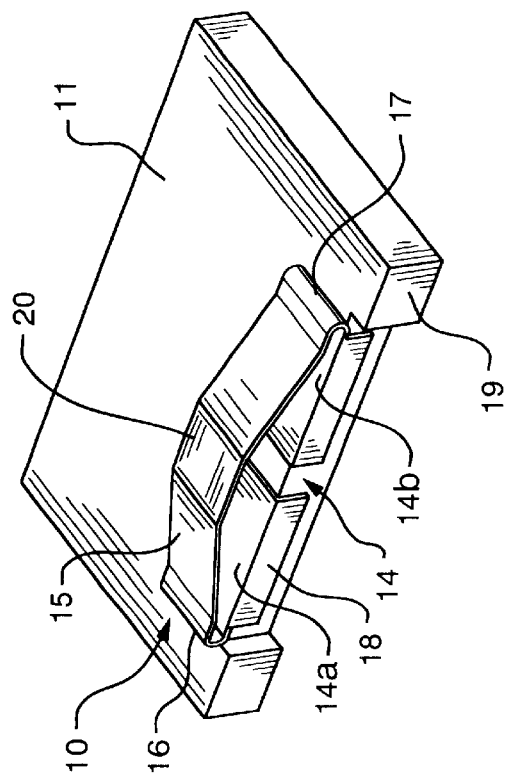
FIG. 3 is a simplified perspective view of a conductor clip of the present invention.
Figure 6:
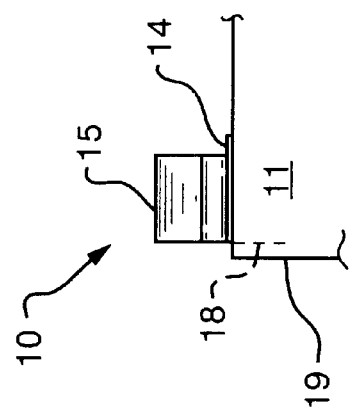
FIG. 6 is an end view of the conductor clip of the present invention.
Figure 5:
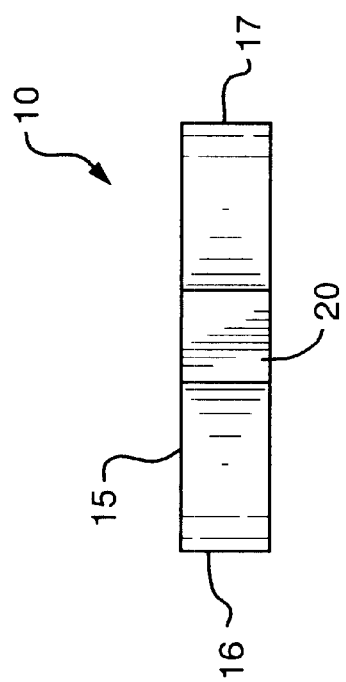
FIG. 5 is a top view of the conductor clip of the present invention.

An EMI conductor clip 10 of the present invention is shown in context in FIGS. 1 and 2. One or more clips 10 are applied to any open area along the perimeter of a first side, a second side, or both sides of a printed circuit board (PCB) 11 that is insertable into a slot 12 of a housing or chassis 13 designed to retain electronic equipment including, but not limited to printed circuit boards and integrated circuitry. Each of the clips 10 applied to the PCB 11 is designed to contact one or more conductive elements of the PCB 11 and at least one surface of the slot 12 of the chassis 13 within which the PCB 11 is installed to establish a grounding pathway from the PCB 11 to the chassis 13. The clip 10 is fabricated of a conductive material including, but not limited to, a solderable lead-tin combination, copper, copper-beryllium combination, or variants thereof. Its dimensions are selectable as a function of the particular PCB design and the chassis slot configuration. It may be fabricated from a sheet of material. It may be and preferably is, fabricated as a unitary structure. However, it may be fabricated in pieces joined together. The conductive elements of the PCB 11, the clip 10, and the chassis 13 form a substantial portion of an EMI shielding system.

With continuing reference to FIG. 2, the clip 10 is detachably affixed substantially to the side surface of the PCB 11 although, if provided with an optional edge retainer to be described herein, it may contact a portion of the edge of the PCB 11. One or more clips 10 may be applied to the perimeter of the PCB 11, provided no one clip interferes with functional elements of the PCB 11. The clips 10 may be spaced equidistant from one another, as shown. Alternatively, they may be spaced from one another in a variable manner if desired and as a function of the design of the particular PCB 11 and the chassis slot 12. The clip 10 may be joined to the PCB 11 by soldering, mechanical attachment, or bonding with a conductive adhesive. While the clip 10 may be applied directly on the surface of the PCB 11, the PCB 11 is preferably modified in the region where a clip 10 is to be installed by creating a slot or recess for retaining the clip 10 and for reducing the overall surface profile of the PCB 11 in the vicinity of the attached clip or clips 10. Forming a notch or recess in the edge of the PCB 11 for placement of the clip 10 limits damage to the clip 10 from the weight of the assembly when slid into the chassis slot 12. This is an advantage of side mounting rather than edge mounting. It is to be noted that a clip 10 may be similarly attached to the opposing surface of the PCB 11 for manufacturing and/or installation convenience and that clips may be located on both surfaces of the PCB 11 for additional conductive surface contact with the chassis slot 12.

As illustrated in FIGS. 3–6, the clip 10 of the present invention is preferably fabricated with a first contact section 14, a second contact section 15, a first transition region 16, a second transition region 17, and an optional edge flap 18. While the first contact section 14 may be formed as a single element, it is preferably formed as two spaced apart contact regions 14a and 14b, as shown. The first contact section 14 is that portion of the clip 10 that contacts the PCB 11. The second contact section 15 may be formed of two regions or as a single element as shown. The second contact section is that portion of the clip 10 that contacts the slot 12 of the chassis 13. The optional edge flap 18 may be formed as a single element or as two spaced apart regions as shown. It may be of the same or differing length as that of the first contact section 14. It may be simply formed by bending over part of the first contact section 14. The edge flap 18 is that portion of the clip 10 that contacts an edge 19 of the PCB 11. The clip 10 is preferably of symmetrical design as shown in the drawings so that a single design can be applied on either side of the PCB 11 at any available location along its perimeter.

The first contact section 14 is affixed to the surface of the PCB 11. Preferably, with the first contact section 14 formed of the two regions 14a and 14b, only one of those two regions should be attached to the PCB 11. Specifically, the one that is at the leading edge with respect to, or that is closest to, the location of the backplane of the PCB 11. The other of the two regions of section 14 should be allowed to slide on the surface to reduce mechanical stress from bending of the PCB 11, which bending could otherwise cause detachment of the clip 10 if it were completely attached. Attachment of the clip 10 may be achieved by soldering, bonding or otherwise attaching it to the PCB 11 surface. The PCB 11 may have a portion modified to include a solderable area for attachment of the clip 10.

The second contact region 15 is spaced from the first contact region 14 by the first transition region 16 and the second transition region. 17. The transition regions 16 and 17 are designed to establish, or aid in establishing, a spring characteristic to the clip 10. The design of the second contact region 15 may further aid in establishing a spring characteristic to the clip 10. In general, the second contact region 15 is compressible so that when the PCB 11 is placed in the slot 12 the second contact region 15 may be compressed inwardly toward the first contact region 14. That compressibility ensures a tight fit and substantial contact between the clip 10 and the chassis 13. In particular, the second contact region 15 is curved, or stepped or otherwise spaced from the first contact region 14 but coupled thereto by the transition regions 16 and 17. Making the transition regions 16 and 17 of arcuate configuration provides a spring-like characteristic to the clip and a relatively smooth transition from the first contact region 14 to the second contact region 15. That shape also reduces the possibility of failure of the clip 10 at those transition points upon repeated insertion and removal of the PCB 11 in a chassis slot 12. The second contact region 15 optionally is designed in a stepped arrangement with two angled regions spaced from one another and connected together by an intermediate flat top surface 20 to aid in the automated pick-and-place application of the clip 10 on the PCB 11 using well-known surface mount technology. For automated application, a plurality of clips 10 may be joined on a tape-and-reel applicator or they may be moved into attachment position using a bulk vibrating feeder as is well known to those skilled in automated dispensation techniques.

While the present invention has been described with specific reference to a particular embodiment, it is not limited thereto. Instead, it is intended that all modifications and equivalents fall within the scope of the following claims.

What is claimed is:

1. A shielding system to minimize the effects of Electromagnetic Interference (EMI) associated with the interface of a printed circuit board and a slot of a chassis suitable for retaining the printed circuit board therein, the system comprising:
   a. one or more conductor clips, each of said conductor clips including:
      i. a first contact section for coupling to a surface of the printed circuit board, wherein said first contact section includes one or more edge flaps;
      ii. a second contact section for contacting the slot of the chassis; and
      iii. means for connecting said first contact section to said second contact section in a spaced apart manner, wherein said second contact section is designed to be compressible toward said first contact section; and
   b. a printed circuit board having a side surface and an edge, wherein said edge includes one or more recesses corresponding in number to the number of said one or more conductor clips, wherein each of said recesses is designed to retain therein said one or more edge flaps.

2. The EMI shielding system of claim 1 wherein said second contact section includes two angled regions spaced apart from, and connected together by an intermediate flat top surface.

3. The EMI shielding system of claim 1 wherein said first contact section, said second contact section, and said means for connecting are formed together as a unitary structure.

4. The EMI shielding system of claim 1 wherein the clip is fabricated of an EMI conductive material.

5. The EMI shielding system of claim 4 wherein said EMI conductive material is selected from the group consisting of lead-tin, copper, copper-beryllium, or any combination thereof.

6. The EMI shielding system of claim 5 wherein said EMI conductive material is solderable.

* * * * *